(12) United States Patent
Radke et al.

(10) Patent No.: US 8,358,542 B2
(45) Date of Patent: Jan. 22, 2013

(54) METHODS, DEVICES, AND SYSTEMS FOR ADJUSTING SENSING VOLTAGES IN DEVICES

(75) Inventors: William H. Radke, Los Gatos, CA (US); Zhenlei Shen, Boise, ID (US); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 165 days.

(21) Appl. No.: 13/007,274

(22) Filed: Jan. 14, 2011

(65) Prior Publication Data

US 2012/0182810 A1   Jul. 19, 2012

(51) Int. Cl.
*G11C 16/06* (2006.01)

(52) U.S. Cl. ......... 365/185.21; 365/185.24; 365/185.17; 365/185.03; 365/189.07

(58) Field of Classification Search ............ 365/185.21, 365/185.24, 185.17, 185.03, 189.07
See application file for complete search history.

(56) References Cited

U.S. PATENT DOCUMENTS

| | | |
|---|---|---|
| 2008/0144388 A1 | 6/2008 | Yamashita |
| 2008/0192541 A1 | 8/2008 | Kang et al. |
| 2008/0244339 A1 | 10/2008 | Kong et al. |
| 2009/0067254 A1 | 3/2009 | Won et al. |
| 2009/0106485 A1 | 4/2009 | Anholt |
| 2009/0282186 A1 | 11/2009 | Mokhlesi et al. |
| 2009/0290426 A1 | 11/2009 | Moschiano et al. |
| 2010/0002506 A1 | 1/2010 | Cho et al. |
| 2010/0124119 A1 | 5/2010 | Lee et al. |
| 2010/0195406 A1* | 8/2010 | Park .......................... 365/185.25 |
| 2011/0280084 A1 | 11/2011 | Radke et al. |

OTHER PUBLICATIONS

Changhyuk Lee, et al., A 32Gb MLC NAND-Flash Memory with Vth-Endurance-Enhancing Schemes in 32NM CMOS, ISSCC 2010, Session 24, DRAM & Flash Memories, 2010 IEEE International Solid-State Circuits Conference, Feb. 10, 2010 (3 pgs.).

International Search Report and Written Opinion for related PCT Application No. PCT/US2012/021054, mailed Aug. 28, 2012, (10 pages).

* cited by examiner

*Primary Examiner* — Thong Q Le
(74) *Attorney, Agent, or Firm* — Brooks, Cameron & Huebsch, PLLC (57) ABSTRACT

The present disclosure includes methods, devices, and systems for adjusting sensing voltages in devices. One or more embodiments include memory cells, and a controller configured to perform a sense operation on the memory cells using a sensing voltage to determine a quantity of the memory cells having a threshold voltage (Vt) greater than the sensing voltage and adjust a sensing voltage used to determine a state of the memory cells based, at least partially, on the determined quantity of memory cells.

34 Claims, 5 Drawing Sheets

METHODS, DEVICES, AND SYSTEMS FOR ADJUSTING SENSING VOLTAGES IN DEVICES

TECHNICAL FIELD

The present disclosure relates generally to semiconductor memory devices, methods, and systems, and more particularly, to methods, devices, and systems for adjusting sensing voltages in devices.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices can be utilized as volatile and non-volatile memory for a wide range of electronic applications. Flash memory devices typically use a one-transistor memory cell that allows for high memory densities, high reliability, and low power consumption. Uses for flash memory include memory for solid state drives (SSDs), personal computers, personal digital assistants (PDAs), digital cameras, cellular telephones, portable music players, e.g., MP3 players, and movie players, among other electronic devices. Data, such as program code, user data, and/or system data, such as a basic input/output system (BIOS), are typically stored in flash memory devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line, which is commonly referred to in the art as a "word line". However each memory cell is not directly coupled to a data line (which is commonly referred to as a digit line, e.g., a bit line, in the art) by its drain. Instead, the memory cells of the array are coupled together in series, source to drain, between a common source and a data line, where the memory cells commonly coupled to a particular data line are referred to as a "column".

Memory cells in a NAND array architecture can be programmed to a target, e.g., desired, state. For example, electric charge can be placed on or removed from a charge storage structure of a memory cell to put the cell into one of a number of programmed states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells can be referred to as multilevel cells (MLCs). MLCs can allow the manufacture of higher density memories without increasing the number of memory cells since each cell can represent more than one digit, e.g., more than one bit. For example, a cell capable of representing four digits can have sixteen programmed states.

Sensing operations, e.g., read and/or program verify operations, can use sensing voltages to determine the state of flash memory cells. However, a number of mechanisms, such as read disturb, program disturb, and/or charge loss, e.g., charge leakage, can cause the stored charge on the charge storage structure, e.g., the threshold voltage (Vt), of the memory cells, to change. As a result of the change in the stored charge, previously used sensing voltages, e.g., sensing voltages used prior to the change in the stored charge occurs, may no longer provide accurate and/or reliable sensing of the memory cells. That is, previously used sensing voltages may result in an erroneous sensing of the memory cells when used during subsequent sensing operations. For example, the use of previous sensing voltages may result in a determination that the memory cells are in a state other than the target state, e.g., a state different than the target state to which the cell was programmed.

DETAILED DESCRIPTION

The present disclosure includes methods, devices, and systems for adjusting sensing voltages in devices. One or more embodiments include memory cells, and a controller configured to perform a sense operation on the memory cells using a sensing voltage to determine a quantity of the memory cells having a threshold voltage (Vt) greater than the sensing voltage and adjust a sensing voltage used to determine a state of the memory cells based, at least partially, on the determined quantity of memory cells.

Embodiments of the present disclosure can be used to track and/or compensate for threshold voltage (Vt) change, e.g., shift, in memory devices and/or systems. Tracking and/or compensating for Vt changes can provide benefits such as increased accuracy and/or reliability, e.g., decreased error rate, and/or increased memory device and/or system life, among other benefits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designators "N" and "M" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 400 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

Figure 1:
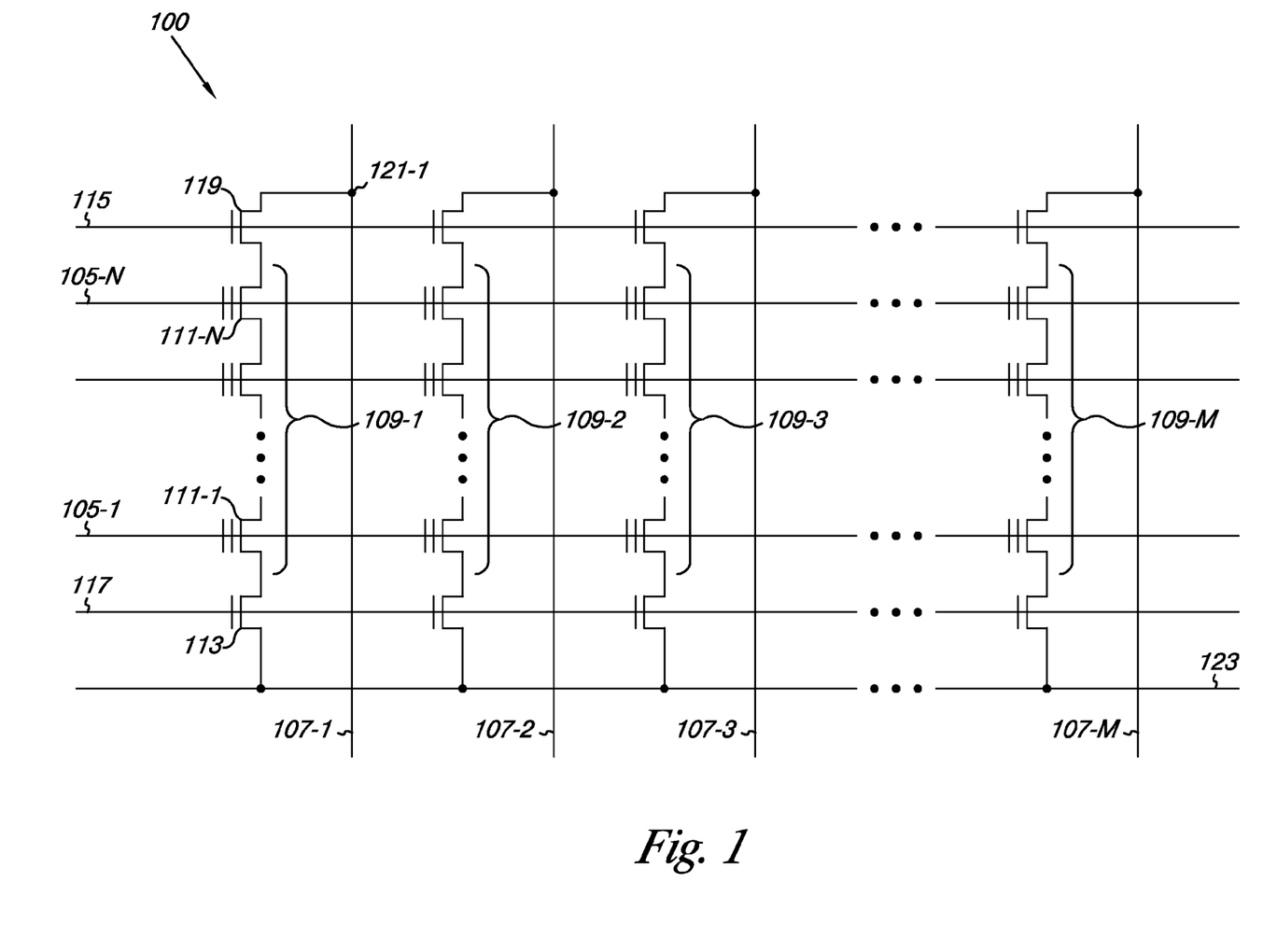
FIG. 1 is a schematic of a portion of a non-volatile memory array in accordance with one or more embodiments of the present disclosure.

FIG. 1 is a schematic of a portion of a non-volatile memory array 100 in accordance with one or more embodiments of the present disclosure. The embodiment of FIG. 1 illustrates a NAND architecture non-volatile memory array. However, embodiments described herein are not limited to this example. As shown in FIG. 1, the memory array 100 includes access lines, e.g., word lines 105-1, . . . , 105-N and intersecting data lines, e.g., local bit lines 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS), e.g., a field-effect transistor (FET) 113, and a drain select gate (SGD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In one or more embodiments, construction of the non-volatile memory cells 111-1, . . . , 111-N includes a source, a drain, a floating gate or other charge storage structure, and a control gate. The non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 109-3, . . . , 109-M, and are coupled to a given local bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line, e.g., 105-1, . . . , 105-N, can be programmed and/or sensed, e.g., read, together as a group. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a target program state.

A sensing operation, such as a read or program verify operation, can include sensing a voltage and/or current change of a bit line coupled to a selected cell in order to determine the state of the selected cell. The sensing operation can involve providing a voltage to, e.g., biasing, a bit line associated with a selected memory cell above a bias voltage provided to a source line associated with the selected memory cell, e.g., source line 123. A sensing operation could alternatively include precharging a bit line and sensing the discharge when a selected cell begins to conduct.

Sensing the state of a selected cell can include providing a number of sensing voltages, e.g., read voltages, to a selected word line while providing a number of voltages, e.g., read pass voltages, to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the state of the selected cell can be determined based on the current and/or voltage sensed on the bit line corresponding to the string. For instance, the state of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

Figure 2:
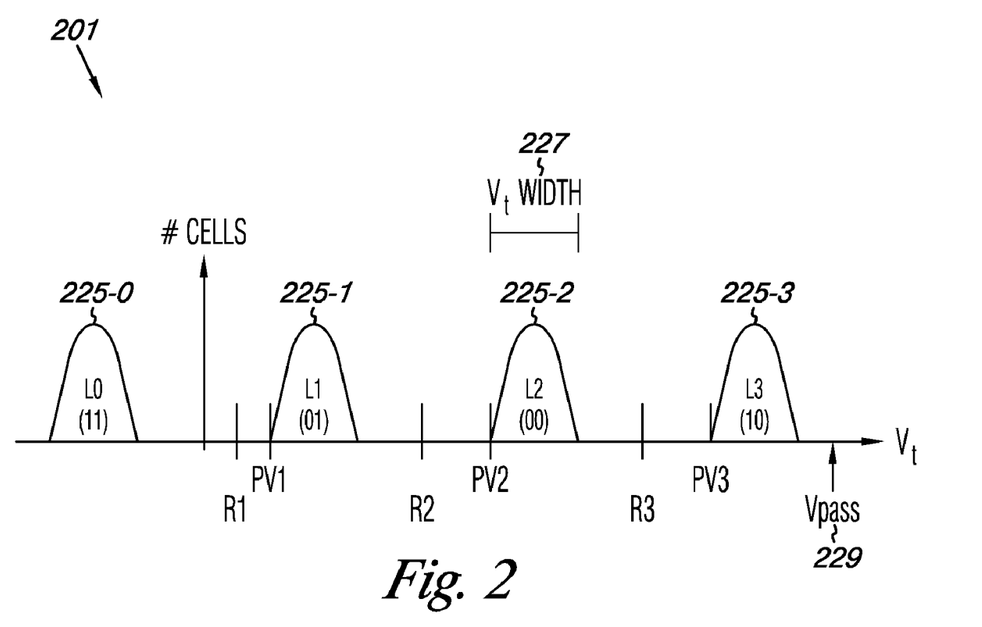
FIG. 2 illustrates a diagram of a number of threshold voltage distributions and sensing voltages in accordance with one or more embodiments of the present disclosure.

FIG. 2 illustrates a diagram 201 of a number of threshold voltage distributions and sensing voltages in accordance with one or more embodiments of the present disclosure. The example shown in FIG. 2 can represent, for example, memory cells 111-1, . . . , 111-N previously described in connection with FIG. 1. The example shown in FIG. 2 represents two-bit, e.g., four-state, memory cells. However, embodiments of the present disclosure are not limited to this example of two-bit memory cells, as will be appreciated by one of ordinary skill in the art.

As shown in FIG. 2, threshold voltage (Vt) distributions 225-0, 225-1, 225-2, and 225-3 represent four target states, e.g., L0, L1, L2, and L3, respectively, to which the memory cells can be programmed. In the example illustrated in FIG. 2, Vt distribution 225-3 can be referred to as a maximum Vt, e.g., "$Vt_{max}$", to which a cell can be programmed because it is the range including the Vt with the largest magnitude. In operation, the memory cells in a selected block can be erased together such that they have a Vt level within Vt distribution 225-0 prior to being programmed. As such, distribution 225-0 can be referred to as an erased state and can represent a particular stored data state (target state L0), e.g., stored data such as binary "11". Target state L1 can correspond to data 01, target state L2 can correspond to data 00, and target state L3 can correspond to data 10. However, embodiments are not limited to these data assignments.

Vt distributions 225-0, 225-1, 225-2, and 225-3 can represent a number of memory cells that are programmed to the corresponding target states, where the height of a Vt distribution curve indicates a number of cells programmed to a particular voltage within the Vt distribution, on average. The width 227 of the Vt distribution curve indicates the range of voltages that represent a particular target state, e.g., the width of the Vt distribution curve 225-2 for L2 represents the range of voltages that correspond to data 00.

A number of sensing voltages are illustrated in FIG. 2. Such sensing voltages can include program verify voltages and/or read voltages, among other sensing voltages. For example, program verify voltages PV1, PV2, and PV3 are illustrated, as well as read voltages R1, R2, and R3. A program verify operation can be performed after one or more programming pulses to help determine whether a memory cell has been programmed within a desired Vt range to help prevent the memory cell from receiving further programming pulses, e.g., "over programming" the cell. For instance, memory cells to be programmed to the L1 target state can be program verified with a voltage PV1. Similarly, program verify voltage PV2 can be used with cells to be programmed to L2 and PV3 can be used with cells to be programmed to L3.

In the example illustrated in FIG. 2, voltage levels R1, R2, and R3 represent sensing voltages, e.g., read voltages, that can be used to distinguish between states L0, L1, L2, and L3 during a sensing operation. In a sensing operation performed on a selected memory cell in a NAND string, the unselected memory cells of the string can be biased with a pass voltage "Vpass" 229 so as to be in a conducting state.

The Vt of a memory cell can change, e.g., shift, over time due to a number of mechanisms. For example, the charge storage structure, e.g., floating gate, of the memory cell may lose charge over time. Such charge loss can cause the Vt of the cell to change, e.g., decrease. Additionally, as the memory cell undergoes programming and/or sensing operations over time, program disturb and/or read disturb mechanisms may cause the Vt of the cell to change, e.g., increase. Other mechanisms can also cause the Vt of the memory cell to change over time, as will be appreciated by one of ordinary skill in the art.

In some instances, such a Vt change can alter the state of the memory cell. For example, if the memory cell were programmed to target state L2, e.g., data 00, charge loss could cause the Vt of the memory cell to decrease to a level less than R2, or possibly to a level within Vt 225-1 corresponding to state L1, e.g., data 01.

Accordingly, such a Vt change can result in erroneous data being sensed during a sensing operation performed on the memory cell using the sensing voltages illustrated in FIG. 2, e.g., read voltages R1, R2 and R3, and/or program verify voltages PV1, PV2, and PV3. For example, performing a sensing operation using the sensing voltages illustrated in FIG. 2 may result in a determination that the memory cell represents a state other than the target state to which the cell was programmed. For instance, a sensing operation performed on a memory cell that was programmed to target state L2 and has undergone charge loss may determine that the cell represents state L1, if read voltage R2 is used in the sensing operation. That is, using read voltage R2 may result in a cell programmed to store data 00 being erroneously sensed as storing data 01.

As such, sensing voltages used during sensing operations performed before the Vt change occurs, e.g., the read and/or program verify voltages illustrated in FIG. 2, may no longer provide accurate and/or reliable sensing of memory cells that have undergone a Vt change, e.g., charge loss. However, adjusting, e.g., changing, the sensing voltages, e.g., to sensing voltages other than those illustrated in FIG. 2, may track and/or compensate for such a Vt change, thereby providing accurate and/or reliable sensing of the memory cells that have undergone the Vt change, as will be further described herein.

Figure 3:
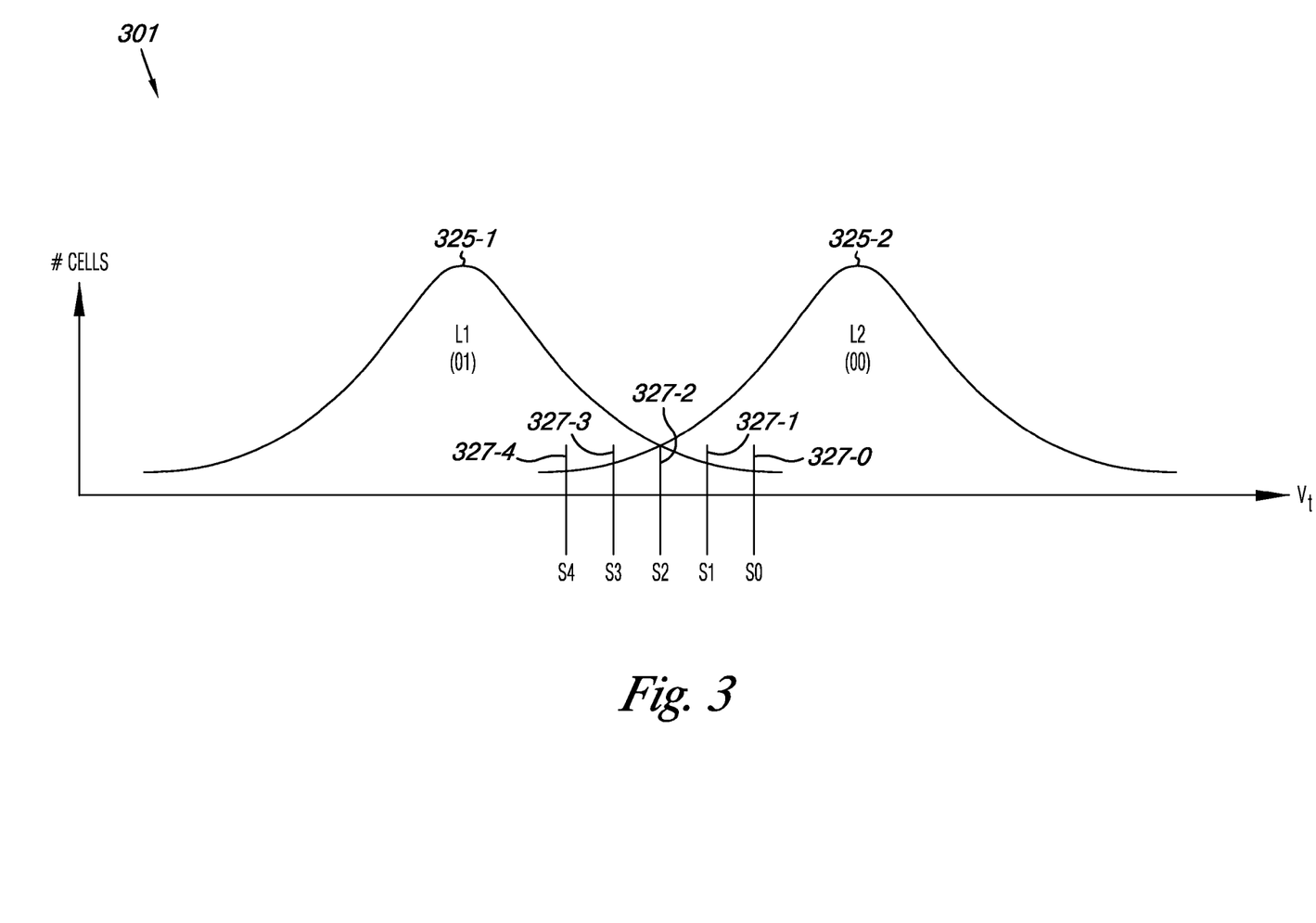
FIG. 3 illustrates a diagram of a number of threshold voltage distributions and sensing voltages in accordance with one or more embodiments of the present disclosure.

FIG. 3 illustrates a diagram 301 of threshold voltage (Vt) distributions 325-1 and 325-2, and sensing voltages S0 (327-0), S1 (327-1), S2 (327-2), S3 (327-3), and S4 (327-4), in accordance with one or more embodiments of the present disclosure. The example shown in FIG. 3 can represent memory cells that have undergone a Vt change, e.g., shift, due to a mechanism such as charge loss, program disturb, and/or read disturb, for example. Vt distributions 325-1 and 325-2 can correspond to Vt distributions 225-1 and 225-2, respectively, previously described in connection with FIG. 2, after the memory cells represented by Vt distributions 225-1 and 225-2 have undergone a Vt change. Further, although not shown in FIG. 3 for simplicity, diagram 301 could also include additional Vt distributions corresponding to Vt distributions 225-0 and/or 225-3 previously described in connection with FIG. 2 after the memory cells represented by Vt distributions 225-0 and/or 225-3 have undergone a Vt change.

As shown in FIG. 3, Vt distributions 325-1 and 325-2 have shifted relative to Vt distributions 225-1 and 225-2 shown in FIG. 2, e.g., due to the Vt shifts of the memory cells represented therein. For example, portions of Vt distributions 325-1 and 325-2 overlap, as shown in FIG. 3. Accordingly, sensing voltages used to determine the state of the memory cells before the Vt change occurred, e.g., the sensing voltages illustrated in FIG. 2, may no longer provide accurate and/or reliable sensing of the memory cells, as previously described herein. For instance, a memory cell programmed to target state L2 may be sensed as being in state L1.

However, adjusting the sensing voltages used to determine the state of the memory cells to different sensing voltages, e.g., to sensing voltages other than those illustrated in FIG. 2, can be used to track and/or compensate for the Vt change, thereby providing accurate and/or reliable sensing of the memory cells. For example, in the embodiment illustrated in FIG. 3, adjusting one or more of the sensing voltages, e.g., read voltage R2 previously described in connection with FIG. 2, to sensing voltage S2 may provide accurate and/or reliable sensing of the memory cells. That is, a sensing operation using sensing voltage S2 to determine the state of the memory cells may sense less erroneous data than a sensing operation using a prior sensing voltage, e.g., read voltage R2, illustrated in FIG. 2. For example, sensing voltage S2 can be the sensing voltage that senses the least amount of erroneous data.

The sensing voltage(s) that will provide accurate and/or reliable sensing of the memory cells, e.g., the sensing voltage(s) that will sense the least amount of erroneous data, can be determined based, at least partially, on the quantity of memory cells having a Vt greater than the sensing voltage(s). That is, the adjustment of the sensing voltage used to determine the state of the memory cells can be based, at least partially, on the quantity of memory cells having a Vt greater than the sensing voltage.

For instance, a number of sense operations, e.g., five, can be performed on the memory cells using a number of different sensing voltages, e.g., sensing voltages S0, S1, S2, S3, and/or S4, to determine a quantity of the memory cells having a Vt greater than each sensing voltage. The sensing voltage used to determine the state of the memory cells, e.g., read voltage R2 previously described in connection with FIG. 2, can then be adjusted based, at least partially, on the determined quantities of memory cells.

As an example, a sense operation performed on the memory cells using sensing voltage S0 may determine that 7,000 cells have a Vt greater than sensing voltage S0, a sense operation performed on the memory cells using sensing voltage S1 may determine that 7,200 cells have a Vt greater than sensing voltage S1, sense operation performed using sensing voltage S2 may determine that 7,300 cells have a Vt greater than sensing voltage S2, a sense operation performed using sensing voltage S3 may determine that 7,400 cells have a Vt greater than sensing voltage S3, and a sense operation performed using sensing voltage S4 may determine that 7,600 cells have a Vt greater than sensing voltage S4.

A determined quantity of memory cells having a Vt greater than a sensing voltage can include, for example, all memory cells having a Vt located to the right of the sensing voltage, e.g., all memory cells in diagram 301 whose Vt level is located to the right of the particular sensing voltage, regardless of which Vt distribution the cells are in. The sensing voltages can be spaced apart by a particular, e.g., the same, voltage amount, as illustrated in FIG. 3. Additionally, the voltage amount by which the sensing voltages are spaced apart can depend on whether the memory cells are single level cells (SLCs) or multilevel cells (MLCs). For example, the spacing of the sensing voltages can be lower for MLCs than SLCs, with the voltage spacing decreasing linearly as the level of the cells increases. For example, if the memory cells are SLCs, the sensing voltages can be spaced apart by approximately 100 to 200 millivolts, if the memory cells are two-bit MLCs, the sensing voltages can be spaced apart by approximately 50 to 100 millivolts, and if the memory cells are three-bit MLCs, the sensing voltages can be spaced apart by approximately 25 to 50 millivolts.

The sensing voltage used to determine the state of the memory cells Can then be adjusted based, at least partially, on the determined quantities of memory cells having a Vt greater than each sensing voltage. For instance, differences between the determined quantities of memory cells having a Vt greater than each sensing voltage can be determined. As an example, the difference between the quantity of memory cells having a Vt greater than sensing voltage S1 and the quantity of memory cells having a Vt greater than sensing voltage S0 can be determined, the difference between the quantity of memory cells having a Vt greater than sensing voltage S2 and the quantity of memory cells having a Vt greater than sensing voltage S1 can be determined, the difference between the quantity of memory cells having a Vt greater than sensing voltage S3 and the quantity of memory cells having a Vt greater than sensing voltage S2 can be determined, and/or the difference between the quantity of memory cells having a Vt greater than sensing voltage S4 and the quantity of memory cells having a Vt greater than sensing voltage S3 can be determined. In this example, these differences are 200, 100, 100, and 200, respectively. The sensing voltage used to determine the state of the memory cells can then be adjusted based, at least partially, on the determined differences.

For instance, a trend associated with the determined differences can be determined, and the sensing voltage used to determine the state of the memory cells can then be adjusted based, at least partially, on the determined trend. The determined trend can include, for example, a point at which a minimal determined difference is crossed, e.g., a point at which the determined differences stop decreasing and start increasing. That is, a minimum difference of the determined differences can be determined. In the previous example, the point at which the minimal determined difference is crossed is between sensing voltages S1 and S3, and the minimum difference of the determined differences is 100.

The sensing voltage used to determine the state of the memory cells can then be adjusted based, at least partially, on the point at which the minimal determined difference is crossed. That is, the sensing voltage used to determine the state of the memory cells can then be adjusted based, at least partially, on the determined minimum difference. For instance, the sensing voltage used to determine the state of the memory cells can be adjusted to a voltage between the sensing voltages between which the minimal determined difference is crossed. That is, the sensing voltage used to determine the state of the memory cells can be adjusted to a voltage between the sensing voltages associated with the determined minimum difference. In the previous example, the sensing voltage used to determine the state of the memory cells can be adjusted to a voltage between sensing voltages S1 and S3, e.g., sensing voltage S2.

As an additional example, a first sense operation can be performed on the memory cells using a first sensing voltage, e.g., sensing voltage S0, to determine a first quantity of the memory cells having a Vt greater than the first sensing voltage. A second sense operation can also be performed on the memory cells using a second sensing voltage, e.g., sensing voltage S1, that is less than the first sensing voltage to determine a second quantity of the memory cells having a Vt greater than the second sensing voltage. A third sense operation can also be performed on the memory cells using a third sensing voltage, e.g., sensing voltage S2, that is less than the second sensing voltage to determine a third quantity of the memory cells having a Vt greater than the third sensing voltage.

The difference between the third and second quantities of memory cells and the difference between the second and first quantities of memory cells can then be determined and compared. If the difference between the third and second quantities of memory cells and the difference between the second and first quantities of memory cells are equal, the sensing voltage used to determine a state of the memory cells can be adjusted to the second sensing voltage, e.g., from read voltage R2 previously described in connection with FIG. 2 to sensing voltage S1.

If the difference between the third and second quantities of memory cells is greater than the difference between the second and first quantities of memory cells, a fourth sense operation can be performed on the memory cells using a fourth sensing voltage that is greater than the first sensing voltage to determine a fourth quantity of memory cells having a Vt greater than the fourth sensing voltage. The difference between the first and fourth quantities of memory cells can then be determined and compared to the difference between the second and first quantities of memory cells. If the difference between the first and fourth quantities of memory cells is equal to the difference between the second and first quantities of memory cells, the sensing voltage used to determine a state of the memory cells, e.g., read voltage R2, can be adjusted to the first sensing voltage, e.g., from read voltage R2 to sensing voltage S0.

If the difference between the first and fourth quantities of memory cells is greater than the difference between the second and first quantities of memory cells, the sensing voltage used to determine a state of the memory cells can be adjusted to a voltage between the first and second sensing voltages. As an example, one or more additional sensing operations can be performed to determine the adjusted voltage between the first and second sensing voltages, e.g., to further precision the adjusted voltage between the first and second sensing voltages. For instance, a fifth sense operation can be performed on the memory cells using a sensing voltage, e.g., a fifth sensing voltage, that is halfway between the first and second sensing voltages to determine a fifth quantity of memory cells having a Vt greater than the fifth sensing voltage. The difference between the second and fifth quantities of memory cells and the difference between the fifth and first quantities of memory cells can then be determined and compared. If the difference between the second and fifth quantities of memory cells is greater than the difference between the fifth and first quantities of memory cells, the sensing voltage used to determine a state of the memory cells can be adjusted to a voltage between the first and fifth sensing voltages. As an example, one or more additional sensing operations can be performed to determine the adjusted voltage between the first and fifth sensing voltages, e.g., to further precision the adjusted voltage between the first and fifth sensing voltages, in an analogous manner using an additional sensing voltage that is halfway between the first and fifth sensing voltages. If the difference between the second and fifth quantities of memory cells is less than the difference between the fifth and first quantities of memory cells, the sensing voltage used to determine a state of the memory cells can be adjusted to a voltage between the fifth and second sensing voltages, e.g., to further precision the adjusted voltage between the fifth and second sensing voltages, in an analogous manner using an additional sensing voltage that is halfway between the fifth and second sensing voltages. If the difference between the second and fifth quantities of memory cells is equal to the difference between the fifth and first quantities of memory cells, the sensing voltage used to determine a state of the memory cells can be adjusted to the fifth sensing voltage.

If the difference between the first and fourth quantities of memory cells is less than the difference between the second and first quantities of memory cells, a sixth sense operation can be performed on the memory cells using a sixth sensing voltage that is greater than the fourth sensing voltage to determine a sixth quantity of memory cells having a Vt greater than the sixth sensing voltage. The difference between the fourth and sixth quantities of memory cells can then be determined and compared to the difference between the first and fourth quantities of memory cells, and the sensing voltage used to determine a state of the memory cells can be adjusted, in a manner analogous to that previously described herein.

If the difference between the third and second quantities of memory cells is less than the difference between the second and first quantities of memory cells, a fourth sense operation can be performed on the memory cells using a fourth sensing voltage, e.g., sensing voltage S3, that is less than the third sensing voltage to determine a fourth quantity of memory cells having a Vt greater than the fourth sensing voltage. The difference between the fourth and third quantities of memory cells can then be determined and compared to the difference between the third and second quantities of memory cells. If the difference between the fourth and third quantities of memory cells is equal to the difference between the third and second quantities of memory cells, the sensing voltage used to determine a state of the memory cells can be adjusted to the third sensing voltage, e.g., from read voltage R2 to sensing voltage S2.

If the difference between the fourth and third quantities of memory cells is greater than the difference between the third and second quantities of memory cells, the sensing voltage used to determine a state of the memory cells, e.g., read voltage R2, can be adjusted to a voltage between the second and third sensing voltages. As an example, one or more additional sensing operations can be performed using one or more additional sensing voltages, e.g., a sensing voltage that is halfway between the second and third sensing voltages, to determine the adjusted voltage between the second and third sensing voltages, e.g., to further precision the adjusted voltage between the second and third sensing voltages, in a manner analogous to that previously described herein.

If the difference between the fourth and third quantities of memory cells is less than the difference between the third and second quantities of memory cells, a fifth sense operation can be performed on the memory cells using a fifth sensing voltage, e.g., sensing voltage S4, that is less than the fourth sensing voltage to determine a fifth quantity of memory cells having a Vt greater than the fifth sensing voltage. The difference between the fifth and fourth quantities of memory cells can then be determined and compared to the difference between the fourth and third quantities of memory cells, and the sensing voltage used to determine a state of the memory cells can be adjusted, in a manner analogous to that previously described herein.

Figure 4:
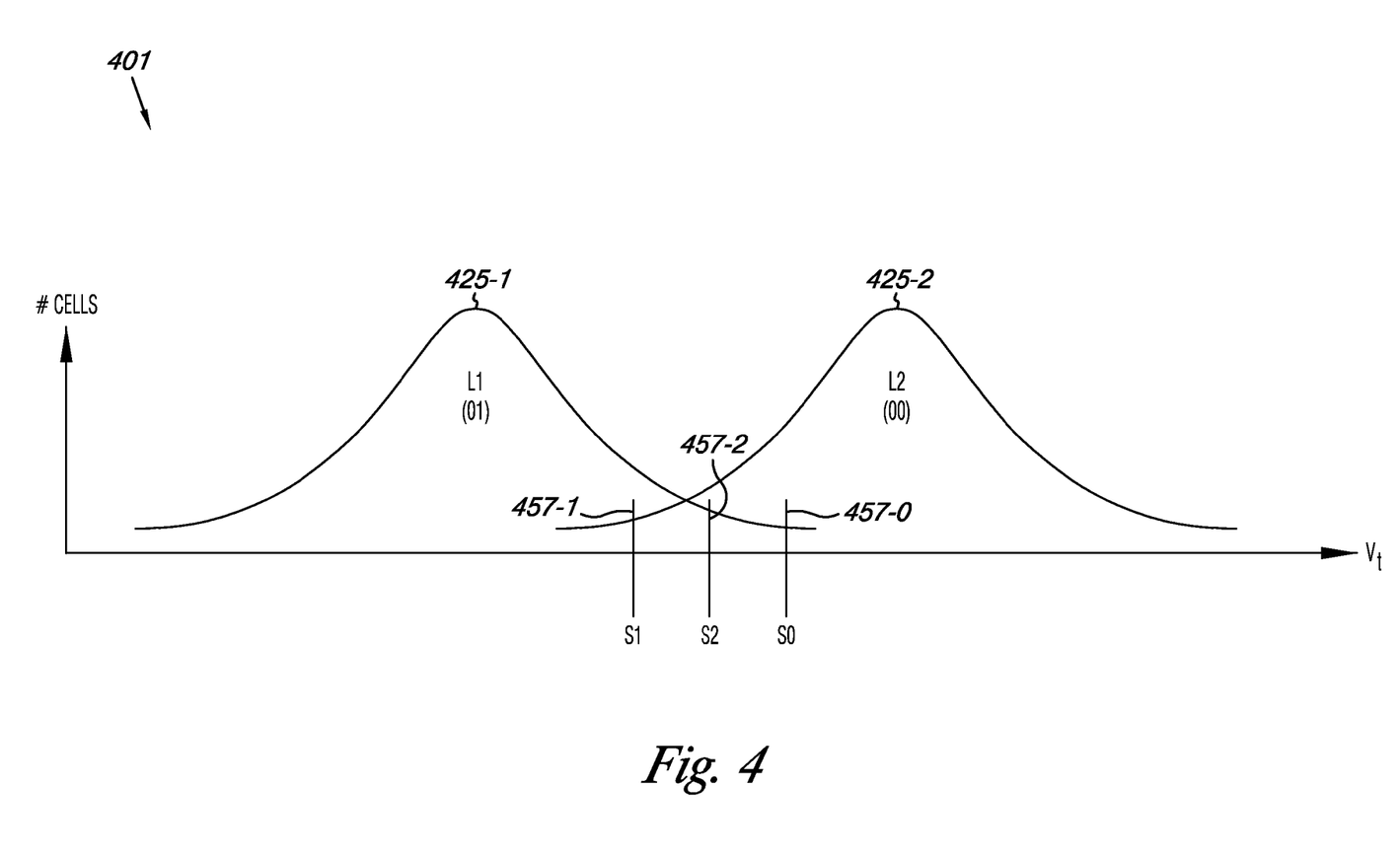
FIG. 4 illustrates a diagram of a number of threshold voltage distributions and sensing voltages in accordance with one or more embodiments of the present disclosure.

FIG. 4 illustrates a diagram 401 of threshold voltage (Vt) distributions 425-1 and 425-2, and sensing voltages S0 (457-0), S1 (457-1), and S2 (457-2) in accordance with one or more embodiments of the present disclosure. The example shown in FIG. 4 can represent memory cells that have undergone a Vt change, e.g., shift, due to a mechanism such as charge loss, program disturb, and/or read disturb, for example, in a manner analogous to that previously described in connection with FIG. 3. That is, Vt distributions 425-1 and 425-2 can correspond to Vt distributions 225-1 and 225-2, respectively, previously described in connection with FIG. 2, after the memory cells represented by Vt distributions 225-1 and 225-2 have undergone a Vt change, in a manner analogous to Vt distributions 325-1 and 325-2 previously described in connection with FIG. 3. Accordingly, sensing voltages used to determine the state of the memory cells before the Vt change occurred, e.g., the sensing voltages illustrated in FIG. 2, may no longer provide accurate and/or reliable sensing of the memory cells, as previously described herein.

However, adjusting the sensing voltages used to determine the state of the memory cells to different sensing voltages, e.g., to sensing voltages other than those illustrated in FIG. 2, can be used to track and/or compensate for the Vt change, thereby providing accurate and/or reliable sensing of the memory cells, as previously described herein. The sensing voltage(s) that will provide accurate and/or reliable sensing of the memory cells, e.g., the sensing voltage(s) that will sense the least amount of erroneous data, can be determined based, at least partially, on the quantity of memory cells having a Vt greater than the sensing voltage(s). That is, the adjustment of the sensing voltage used to determine the state of the memory cells can be based, at least partially, on the quantity of memory cells having a Vt greater than the sensing voltage.

For instance, a number of sense operations, e.g., three, can be performed on the memory cells using a number of different sensing voltages, e.g., sensing voltages S0, S1, and/or S2, to determine a quantity of the memory cells having a Vt greater than each sensing voltage. The sensing voltage used to determine the state of the memory cells, e.g., read voltage R2 previously described in connection with FIG. 2, can then be adjusted based, at least partially, on the determined quantities of memory cells.

As an example, a sense operation performed on the memory cells using sensing voltage S0 may determine that 7,000 cells have a Vt greater than sensing voltage S0, a sense operation performed on the memory cells using sensing voltage S1 may determine that 7,400 cells have a Vt greater than sensing voltage S1, and a sense operation performed on the memory cells using sensing voltage S2 may determine that 7,300 cells have a Vt greater than sensing voltage S2.

A determined quantity of memory cells having a Vt greater than a sensing voltage can include, for example, all memory cells having a Vt located to the right of the sensing voltage, e.g., all memory cells in diagram 401 whose Vt level is located to the right of the sensing voltage, regardless of which Vt distribution the cells are in. Additionally and/or alternatively, a determined quantity of memory cells having a Vt greater than a sensing voltage can include, for example, all memory cells having a Vt located within a defined Vt region to the right of the sensing voltage. The defined Vt region can be, for example, a Vt distribution, a portion of a Vt distribution, or multiple Vt distributions. Further, the sensing voltages can be spaced apart by different voltage amounts, as shown in FIG. 4. The voltage amounts by which the sensing voltages are spaced apart can depend on, for example, a comparison of the determined quantities of memory cells to a stored value, as will be further described herein.

The sensing voltage used to determine the state of the memory cells can be adjusted based, at least partially, on the determined quantities of memory cells. For instance, the determined quantities of memory cells can each be compared to a stored value. The stored value can correspond to a quantity of the memory cells programmed to a Vt within a defined Vt region. The defined Vt region can be, for example, a Vt distribution corresponding to a programmed state of the memory cells, e.g., Vt distributions 225-2 and/or 225-3 previously described in connection with FIG. 2, a portion of a Vt distribution corresponding to a programmed state of the memory cells, or multiple Vt distributions corresponding to multiple programmed states of the memory cells. As an example, the stored value may be 7,315, e.g., 7,315 cells may have been programmed to a Vt within either Vt distributions 225-2 or Vt distribution 225-3 previously described in connection with FIG. 2.

The sensing voltage used to determine the state of the memory cells can then be adjusted based, at least partially, on the comparison. For instance, if a determined quantity of memory cells is within a particular range of the stored value, the sensing voltage used to determine the state of the memory cells can be adjusted to the sensing voltage used to perform the sensing operation that determined the quantity of memory cells that is within the particular range of the stored value. The particular range of the stored value can be, for example, a range associated with a passage of an error correction operation, e.g., a subsequent error correction operation to be performed on data subsequently sensed using the adjusted sensing voltage. That is, the particular range of the stored value can correspond to a quantity of bits, e.g., 60, correctable by a subsequent error correction operation performed on data subsequently sensed using the adjusted sensing voltage.

In the previous example, the determined quantity of memory cells having a Vt greater than S0, e.g., 7,000, and the determined quantity of memory cells having a Vt greater than S1, e.g., 7,400, are not within the particular range, e.g., 60, of the stored value, e.g., 7,315. However, the determined quantity of memory cells having a Vt greater than S2, e.g., 7,300, is within the particular range of the stored value. Accordingly, the sensing voltage used to determine the state of the memory cells can be adjusted to sensing voltage S2.

As an additional example, a first sense operation can be performed on the memory cells using a first sensing voltage, e.g., sensing voltage S0, to determine a first quantity of the memory cells having a Vt greater than the first sensing voltage. The first quantity of memory cells can then be compared to a stored value. The stored value can correspond to a quantity of the memory cells programmed to a Vt within a defined Vt region, as previously described herein.

If the first quantity of memory cells is within a particular range of the stored value, the sensing voltage used to determine a state of the memory cells can be adjusted to the first sensing voltage. The particular range of the stored value can be, for example, a range associated with a passage of an error correction operation, as previously described herein.

If the first quantity of memory cells is not within the particular range of the stored value, a second sense operation can be performed on the memory cells using a second sensing voltage, e.g., sensing voltage S1, to determine a second quantity of the memory cells having a Vt greater than the second sensing voltage. The second sensing voltage can be greater than the first sensing voltage if the first quantity of memory cells is greater than the stored value, and the second sensing voltage can be less than the first sensing voltage if the first quantity of memory cells is less than the stored value. Additionally, the voltage amount by which the second sensing voltage is spaced apart from the first sensing voltage can be based, at least partially, on the amount by which the first quantity of memory cells is outside the particular range of the stored value. For example, the spacing between the second sensing voltage and the first sensing voltage can increase as the amount by which the first quantity of memory cells is outside the particular range of the stored value increases.

The second quantity of memory cells can then be compared to the stored value. If the second quantity of memory cells is within the particular range of the stored value, the sensing voltage used to determine a state of the memory cells can be adjusted to the second sensing voltage. If the second quantity of memory cells is not within the particular range of the stored value, this process can be repeated using one or more additional sensing voltages, e.g., sensing voltage S3.

Figure 5:
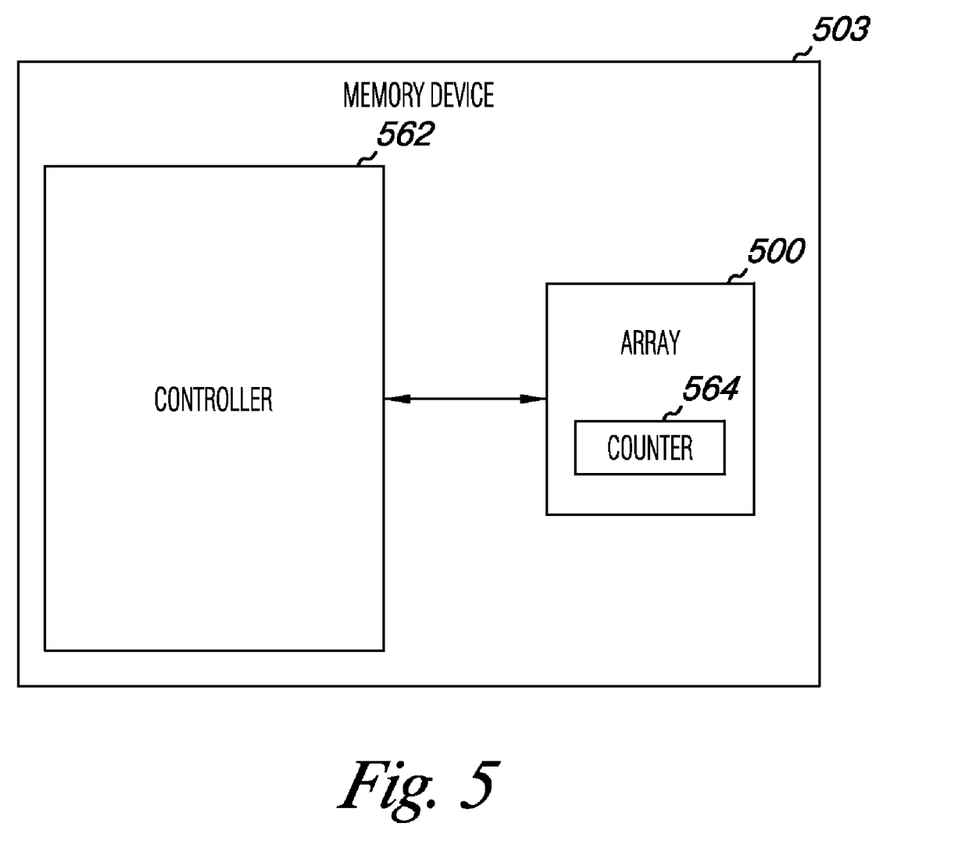
FIG. 5 illustrates a block diagram of a memory device in accordance with one or more embodiments of the present disclosure.

FIG. 5 illustrates a block diagram of a memory device 503 in accordance with one or more embodiments of the present disclosure. As shown in FIG. 5, memory device 503 includes a memory array 500 and a controller 562 coupled to memory array 500. Memory array 500 can optionally include a counter 564, as shown in FIG. 5. Counter 564 can be located at, for example, an end of one or more word lines in memory array 500.

Memory array 500 can be, for example, memory array 100 previously described in connection with FIG. 1. Although one memory array is shown in FIG. 5, embodiments of the present disclosure are not so limited, e.g., memory device 503 can include more than one memory array coupled to controller 562. Controller 562 can include, for example, control circuitry and/or firmware, and can be included on the same physical device, e.g., the same die, as memory array 500, or can be included on a separate physical device that is communicatively coupled to the physical device that includes memory array 500.

Controller 562 can track and/or compensate for a threshold voltage (Vt) change, e.g., shift, in the memory cells in memory array 500 by adjusting a sensing voltage, e.g., a read voltage, used to determine a state of the memory cells. The adjustment of the sensing voltage used to determine the state of the memory cells can be based, at least partially, on the quantity of memory cells having a Vt greater than a number of sensing voltages, as previously described herein.

For example, controller 562 can perform a number of sense operations on a number of the memory cells in memory array 500 using a number of different sensing voltages to determine a quantity of the memory cells having a Vt greater than each respective sensing voltage, in a manner analogous to that previously described in connection with FIG. 3 and/or 4. For example, controller 562 can include a counter (not shown in FIG. 5) to count the quantity of the memory cells having a Vt greater than each sensing voltage.

Controller 562 can then adjust a sensing voltage used to determine the state of the memory cells based, at least partially, on the determined quantities of memory cells, in a manner analogous to that previously described in connection with FIG. 3 and/or 4. For example, controller 562 can determine differences between the determined quantities of memory cells, and adjust the sensing voltage used to determine the state of the memory cells based, at least partially, on the determined differences. Additionally and/or alternatively, controller 562 can compare the determined quantities of memory cells to a stored value, and adjust the sensing voltage used to determine the state of the memory cells based, at least partially, on the comparison.

The stored value can correspond to a quantity of the memory cells programmed to a Vt within a defined Vt region, as previously described in connection with FIG. 4. The quantity of memory cells programmed to the Vt within the defined Vt region can be determined by counter 564 located in memory array 500. For example, counter 564 can count the quantity of memory cells programmed to a Vt within the defined Vt region as the cells are being programmed. Additionally, the stored value can be stored in memory array 500. That is, one or more memory cells in memory array 500 can store data corresponding to the quantity of memory cells programmed to a Vt within the defined Vt region.

Controller 562 can determine a state of a number of the memory cells in memory array 500 using the adjusted sensing voltage. For example, controller 562 can perform a sense operation on the memory cells using the adjusted sensing voltage to sense the state of the memory cells.

Controller 562 can perform, e.g., automatically, the number of sense operations to determine the quantity of the memory cells having a Vt greater than each sensing voltage in response to a failure of an error correction operation performed on data associated with a determined, e.g., sensed, state of the memory cells. The failure of the error correction operation may be caused by, for example, a Vt shift of the memory cells, as previously described herein. The error correction operation can be performed by, for example, an error correction component (not shown in FIG. 5) located in memory device 500, e.g., in controller 562. For example, the error correction component can run an error correction algorithm on the data associated with the determined state of the memory cells.

The embodiment illustrated in FIG. 5 can include additional circuitry that is not illustrated so as not to obscure embodiments of the present disclosure. For example, memory device 503 can include address circuitry to latch address signals provided over I/O connectors through I/O circuitry. Address signals can be received and decoded by a row decoder and a column decoder, to access memory array 500. It will be appreciated by those skilled in the art that the number of address input connectors can depend on the density and architecture of memory device 503 and/or memory array 500.

CONCLUSION

The present disclosure includes methods, devices, and systems for adjusting sensing voltages in devices. One or more embodiments include memory cells, and a controller configured to perform a sense operation on the memory cells using a sensing voltage to determine a quantity of the memory cells having a threshold voltage (Vt) greater than the sensing voltage and adjust a sensing voltage used to determine a state of the memory cells based, at least partially, on the determined quantity of memory cells.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A device, comprising:
   memory cells; and
   a controller configured to:
   perform a sense operation on the memory cells using a sensing voltage to determine a quantity of the memory cells having a threshold voltage (Vt) greater than the sensing voltage; and
   adjust a sensing voltage used to determine a state of the memory cells based, at least partially, on the determined quantity of memory cells.

2. The device of claim 1, wherein the controller is configured to:
   perform an additional sense operation on the memory cells using an additional sensing voltage to determine a quantity of the memory cells having a Vt greater than the additional sensing voltage; and
   adjust the sensing voltage used to determine the state of the memory cells based, at least partially, on the determined quantity of memory cells having a Vt greater than the additional sensing voltage.

3. The device of claim 2, wherein the controller is configured to:
   determine a difference between the determined quantity of memory cells having a Vt greater than the sensing voltage and the determined quantity of memory cells having a Vt greater than the additional sensing voltage; and adjust the sensing voltage used to determine the state of the memory cells based, at least partially, on the determined difference.

4. The device of claim 1, wherein the controller is configured to:
compare the determined quantity of memory cells to a stored value; and
adjust the sensing voltage used to determine the state of the memory cells based, at least partially, on the comparison.

5. The device of claim 1, wherein the controller is configured to perform the sense operation on the memory cells in response to a failure of an error correction operation.

6. A method for operating a device, comprising:
performing a number of sense operations on a number of memory cells, wherein each sense operation is performed using a different sensing voltage;
determining, for each of the different sensing voltages, a quantity of the number of memory cells having a threshold voltage (Vt) greater than the respective sensing voltage; and
adjusting a sensing voltage used to determine a state of the number of memory cells based, at least partially, on the determined quantities of memory cells.

7. The method of claim 6, wherein the method includes:
determining differences between the determined quantities of memory cells; and
adjusting the sensing voltage used to determine the state of the number of memory cells based, at least partially, on the determined differences.

8. The method of claim 6, wherein the method includes:
comparing the determined quantities of memory cells; and
adjusting the sensing voltage used to determine the state of the number of memory cells based, at least partially, on the comparison.

9. The method of claim 8, wherein comparing the determined quantities of memory cells includes comparing the determined quantities of memory cells to a stored value.

10. The method of claim 6, wherein the method includes determining a state of each of the memory cells using the adjusted sensing voltage.

11. A device, comprising:
memory cells; and
a controller configured to:
perform a number of sense operations on the memory cells, wherein each sense operation is performed using a different sensing voltage;
determine, after each sense operation, a quantity of the memory cells having a threshold voltage (Vt) greater than the sensing voltage used in the respective sense operation;
determine differences between the determined quantities of memory cells; and
adjust a sensing voltage used to determine a state of the memory cells based, at least partially, on the determined differences.

12. The device of claim 11, wherein the controller is configured to:
determine a trend associated with the determined differences; and
adjust the sensing voltage used to determine the state of the memory cells based, at least partially, on the determined trend.

13. The device of claim 11, wherein the controller is configured to:
determine a minimum difference of the determined differences; and
adjust the sensing voltage used to determine the state of the memory cells based, at least partially, on the determined minimum difference.

14. The device of claim 11, wherein each sensing voltage is spaced apart by a particular voltage amount.

15. The device of claim 11, wherein:
the memory cells are two-bit memory cells; and
each sensing voltage is spaced apart by approximately 50 to 100 millivolts.

16. The device of claim 11, wherein the number of sense operations is at least three.

17. A method for operating a device, comprising:
determining a first quantity of memory cells having a threshold voltage (Vt) greater than a first sensing voltage, a second quantity of memory cells having a Vt greater than a second sensing voltage, and a third quantity of memory cells having a Vt greater than a third sensing voltage; and
adjusting a sensing voltage used to determine a state of the memory cells to a voltage between the first and second sensing voltages if a difference between the third and second quantities of memory cells is greater than a difference between the second and first quantities of memory cells.

18. The method of claim 17, wherein the method includes adjusting the sensing voltage used to determine the state of the memory cells to the second sensing voltage if the difference between the third and second quantities of memory cells is equal to the difference between the second and first quantities of memory cells.

19. The method of claim 17, wherein:
the second sensing voltage is less than the first sensing voltage; and
the third sensing voltage is less than the second sensing voltage.

20. The method of claim 19, wherein the method includes, if the difference between the third and second quantities of memory cells is greater than a difference between the second and first quantities of memory cells:
determining a fourth quantity of memory cells having a Vt greater than a fourth sensing voltage, wherein the fourth sensing voltage is greater than the first sensing voltage;
determining, if a difference between the first and fourth quantities of memory cells is greater than a difference between the second and first quantities of memory cells, a fifth quantity of memory cells having a Vt greater than a fifth sensing voltage, wherein the fifth sensing voltage is halfway between the first and second sensing voltages;
adjusting the sensing voltage used to determine the state of the memory cells to a voltage between the first and fifth sensing voltages if a difference between the second and fifth quantities of memory cells is greater than a difference between the fifth and first quantities of memory cells; and
adjusting the sensing voltage used to determine the state of the memory cells to a voltage between the fifth and second sensing voltages if the difference between the second and fifth quantities of memory cells is less than the difference between the fifth and first quantities of memory cells.

21. The method of claim 20, wherein the method includes adjusting the sensing voltage used to determine the state of the memory cells to the fifth sensing voltage if the difference between the second and fifth quantities of memory cells is equal to the difference between the fifth and first quantities of memory cells.

22. The method of claim 19, wherein the method includes, if the difference between the third and second quantities of memory cells is less than the difference between the second and first quantities of memory cells:
    determining a fourth quantity of memory cells having a Vt greater than a fourth sensing voltage, wherein the fourth sensing voltage is less than the third sensing voltage; and
    adjusting the sensing voltage used to determine the state of the memory cells to a voltage between the second and third sensing voltages if a difference between the fourth and third quantities of memory cells is greater than a difference between the third and second quantities of memory cells.

23. A device, comprising:
    memory cells; and
    a controller configured to:
        perform a number of sense operations on a number of the memory cells, wherein each sense operation is performed using a different sensing voltage;
        determine a quantity of the number of memory cells having a threshold voltage (Vt) greater than the respective sensing voltage used in the respective sense operation;
        compare the determined quantities of memory cells to a stored value, wherein the stored value corresponds to a quantity of the number of memory cells programmed to a Vt within a defined Vt region; and
        adjust a sensing voltage used to determine a state of the number of memory cells based, at least partially, on the comparison.

24. The device of claim 23, further including a counter configured to count the quantity of the number of memory cells programmed to a Vt within the defined Vt region.

25. The device of claim 23, wherein the stored value is stored in the memory cells.

26. The device of claim 23, wherein the defined Vt region is at least a portion of a Vt distribution corresponding to a programmed state of the memory cells.

27. The device of claim 23, wherein each sensing voltage is spaced apart by a different voltage amount.

28. The device of claim 27, wherein the voltage amount by which each sensing voltage is spaced apart depends on the comparison of the determined quantities of memory cells to the stored value.

29. The device of claim 23, wherein the controller is configured to determine the quantity of the number of memory cells having a Vt greater than the respective sensing voltage used in the respective sense operation after each sense operation.

30. A method for operating a device, comprising:
    performing a sense operation using a sensing voltage to determine a quantity of memory cells having a threshold voltage (Vt) greater than the sensing voltage;
    comparing the determined quantity of memory cells to a stored value; and
    adjusting a previous sensing voltage used to determine a state of the memory cells to the sensing voltage if the determined quantity of memory cells is within a particular range of the stored value.

31. The method of claim 30, wherein the method includes, if the determined quantity of memory cells is not within the particular range of the stored value:
    performing an additional sense operation using an additional sensing voltage to determine a quantity of memory cells having a Vt greater than the additional sensing voltage;
    comparing the determined quantity of memory cells having a Vt greater than the additional sensing voltage to the stored value; and
    adjusting the previous sensing voltage used to determine the state of the memory cells to the additional sensing voltage if the determined quantity of memory cells having a Vt greater than the additional sensing voltage is within the particular range of the stored value.

32. The method of claim 31, wherein:
    the additional sensing voltage used in the additional sense operation is greater than the sensing voltage used in the sense operation if the determined quantity of memory cells having a Vt greater than the sensing voltage is greater than the stored value; and
    the additional sensing voltage used in the additional sense operation is less than the sensing voltage used in the sense operation if the determined quantity of memory cells having a Vt greater than the sensing voltage is less than the stored value.

33. The method of claim 31, wherein the additional sensing voltage and the sensing voltage are spaced apart by a voltage amount that is based, at least partially, on an amount by which the determined quantity of memory cells having a Vt greater than the sensing voltage is outside the particular range of the stored value.

34. The method of claim 30, wherein the particular range of the stored value is a range associated with a passage of an error correction operation.

\* \* \* \* \*